United States Patent
Mori et al.

(10) Patent No.: US 8,933,620 B2
(45) Date of Patent: Jan. 13, 2015

(54) WHITE LIGHT LED MODULE WITH GREEN AND RED PHOSPHORS AND ILLUMINATION DEVICE HAVING THE SAME

(75) Inventors: Toshio Mori, Hyogo (JP); Hiromi Tanaka, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 0 days.

(21) Appl. No.: 13/978,890

(22) PCT Filed: Aug. 29, 2011

(86) PCT No.: PCT/JP2011/004779
§ 371 (c)(1),
(2), (4) Date: Jul. 10, 2013

(87) PCT Pub. No.: WO2012/104937
PCT Pub. Date: Aug. 9, 2012

(65) Prior Publication Data
US 2013/0300282 A1     Nov. 14, 2013

(30) Foreign Application Priority Data
Feb. 3, 2011  (JP) ................................. 2011-021797

(51) Int. Cl.
*H01L 33/50*  (2010.01)
*F21S 2/00*  (2006.01)
(Continued)

(52) U.S. Cl.
CPC ............... *F21S 2/00* (2013.01); *H01L 25/0753* (2013.01); *H01L 33/504* (2013.01); *F21K 9/135* (2013.01); *F21K 9/17* (2013.01); *F21V 3/00* (2013.01);
(Continued)

(58) Field of Classification Search
CPC ....................................... H01L 33/504
USPC .................................. 313/501, 503
See application file for complete search history.

(56) References Cited

U.S. PATENT DOCUMENTS

2008/0180948 A1  7/2008  Yoon et al.
2010/0295464 A1  11/2010  Kasakura et al.
2012/0300432 A1  11/2012  Matsubayashi et al.

FOREIGN PATENT DOCUMENTS

JP  2002-057376  2/2002
JP  2003-249689  9/2003
(Continued)

OTHER PUBLICATIONS

International Search Report and Written Opinion (ISR/WO), mail date is Oct. 4, 2011, together with an English language translation of ISR, for PCT/JP2011/004779.

*Primary Examiner* — Britt D Hanley
*Assistant Examiner* — Steven Horikoshi
(74) *Attorney, Agent, or Firm* — Greenblum & Bernstein, P.L.C.

(57) ABSTRACT

Provided is an LED module and an illumination device having high color saturation, which improve vividness of color of an illuminated object even if color temperature of ambient light is high, and consequently are able to reproduce colors of the object as desired. Blue LEDs have peak wavelength of 420 nm to 470 nm and FWHM of greater than 0 nm and no greater than 50 nm. A green phosphor has peak wavelength of 500 nm to 535 nm and FWHM of 100 nm to 110 nm. A red phosphor has peak wavelength of 610 nm to 670 nm and FWHM of 85 nm to 95 nm. Mixed-color light of the blue, green and red light has correlated color temperature of 4600 K to 7200 K and Duv of −12 to −6.

4 Claims, 9 Drawing Sheets

(51) Int. Cl.
*H01L 25/075* (2006.01)
*F21K 99/00* (2010.01)
*F21V 3/00* (2006.01)
*F21Y 101/02* (2006.01)
*F21Y 103/00* (2006.01)

(52) U.S. Cl.
CPC ........ *F21Y 2101/02* (2013.01); *F21Y 2103/003* (2013.01)
USPC .......................................... 313/501

(56) References Cited

FOREIGN PATENT DOCUMENTS

| | | |
|---|---|---|
| JP | 2007-266579 | 10/2007 |
| JP | 2008-166825 | 7/2008 |
| JP | 2009-238729 | 10/2009 |
| WO | WO 2009063915 A1 * | 5/2009 |

* cited by examiner

FIG. 6A  Green 535 nm-Red 610 nm   $\Delta \lambda_{R-G} = 75$

| Chromaticity Color temperature(K) | Duv | Red phosphor Peak (nm) | FWHM (nm) | Green phosphor Peak (nm) | FWHM (nm) | Ga |
|---|---|---|---|---|---|---|
| 4600 | -6 | 610 | 91 | 535 | 104 | 97.5 |
| 5000 | | | | | | 97.5 |
| 7200 | | | | | | 97.5 |
| 4600 | -12 | 610 | 91 | 535 | 104 | 99.6 |
| 5000 | | | | | | 100.2 |
| 7200 | | | | | | 101.5 |

FIG. 6B  Green 535 nm-Red 670 nm   $\Delta \lambda_{R-G} = 135$

| Chromaticity Color temperature(K) | Duv | Red phosphor Peak (nm) | FWHM (nm) | Green phosphor Peak (nm) | FWHM (nm) | Ga |
|---|---|---|---|---|---|---|
| 4600 | -6 | 670 | 91 | 535 | 104 | 109 |
| 5000 | | | | | | 106.8 |
| 7200 | | | | | | 100.1 |
| 4600 | -12 | 670 | 91 | 535 | 104 | 114.1 |
| 5000 | | | | | | 112.2 |
| 7200 | | | | | | 106.5 |

FIG. 6C  Green 520 nm-Red 640 nm   $\Delta \lambda_{R-G} = 120$

| Chromaticity Color temperature(K) | Duv | Red phosphor Peak (nm) | FWHM (nm) | Green phosphor Peak (nm) | FWHM (nm) | Ga |
|---|---|---|---|---|---|---|
| 4600 | -6 | 640 | 91 | 520 | 104 | 112.5 |
| 5000 | | | | | | 111.8 |
| 7200 | | | | | | 109.2 |
| 4600 | -12 | 640 | 91 | 520 | 104 | 116.2 |
| 5000 | | | | | | 115.7 |
| 7200 | | | | | | 114.9 |

FIG. 6D  Green 500 nm-Red 610 nm   $\Delta \lambda_{R-G} = 110$

| Chromaticity Color temperature(K) | Duv | Red phosphor Peak (nm) | FWHM (nm) | Green phosphor Peak (nm) | FWHM (nm) | Ga |
|---|---|---|---|---|---|---|
| 4600 | -6 | 610 | 91 | 500 | 104 | 102.4 |
| 5000 | | | | | | 103.2 |
| 7200 | | | | | | 105.7 |
| 4600 | -12 | 610 | 91 | 500 | 104 | 104.5 |
| 5000 | | | | | | 105.5 |
| 7200 | | | | | | 109.2 |

FIG. 6E  Green 500 nm-Red 670 nm   $\Delta \lambda_{R-G} = 170$

| Chromaticity Color temperature(K) | Duv | Red phosphor Peak (nm) | FWHM (nm) | Green phosphor Peak (nm) | FWHM (nm) | Ga |
|---|---|---|---|---|---|---|
| 4600 | -6 | 670 | 91 | 500 | 104 | 132.7 |
| 5000 | | | | | | 132.5 |
| 7200 | | | | | | 131.1 |
| 4600 | -12 | 670 | 91 | 500 | 104 | 136.8 |
| 5000 | | | | | | 137.4 |
| 7200 | | | | | | 137.8 |

# WHITE LIGHT LED MODULE WITH GREEN AND RED PHOSPHORS AND ILLUMINATION DEVICE HAVING THE SAME

TECHNICAL FIELD

The present invention relates to an LED (Light Emitting Diode) module and an illumination device having high color saturation, which are able to improve vividness of colors of an illuminated object.

BACKGROUND ART

In recent years, use of illumination devices such as LED lamps which use LED modules has become widespread. Preferably, a lamp for general illumination use should illuminate an object so that colors of the object can be viewed as desired. An established method for quantitatively rating quality of colors viewed when using various different illuminants is by using a color rendering index, which rates color rendering properties of an illuminant. The color rendering index is a quantitative measure of a how accurately the illuminant reproduces colors relative to a reference illuminant. Various arts have been proposed for improving color rendering properties as measured using the color rendering index described above. One example of such an art is increasing the number of different color phosphors combined with LEDs. For example, Patent Literature 1 discloses provision of a red phosphor in addition to conventional phosphors (refer to paragraph 0007).

CITATION LIST

Patent Literature

Patent Literature 1: Japanese Patent Application Publication No. 2007-266579

SUMMARY OF INVENTION

Technical Problem

Patent Literature 1 assumes a lamp for general illumination use (refer to paragraph 0002). However, LED lamps are expected to be used in an increasingly wide range of situations. One possible use envisaged for an LED lamp is as a lamp provided in a display case for displaying products. Unfortunately, even for an LED lamp which due to application of a conventional art such as Patent Literature 1 has high color rendering properties (a high color rendering index Ra), when the LED lamp is used in a display case, products such as food products may appear to have an overall subdued yellow tint. The above is due to light emitted by LEDs in the LED lamp having a light-emission spectrum with a large component in the yellow color region. Consequently, the LED lamp may not be able to reproduce colors of the products as desired.

When the conventional art disclosed in Patent Literature 1 is applied to an LED lamp for use in a display case such as described above, an LED lamp with high color rendering properties can be realized through provision of the red phosphor. Unfortunately, an inevitable consequence of provision of the red phosphor is that correlated color temperature (also referred to simply as color temperature below) is decreased. Therefore, when attempting to significantly improve color rendering properties using the above conventional art, only a lamp with low color temperature can be achieved. Recently, there is an increasing trend for display cases to be used in situations where ambient light has high color temperature. For example a display case may be positioned in a room, such as in a shop or a warehouse, having room lighting with high color temperature. When an LED lamp having low color temperature is used in a situation such as described above, vividness of colors of products illuminated by the LED lamp is decreased, for example by the products appearing to have a yellow tint. In recent years there has been a trend towards using room lighting of increasingly high color temperature and consequently opportunities to use LED lamps for product display in conditions where ambient light has high color temperature are likely to increase further in the future.

In response to the above problem, the present invention aims to provide an LED module and an illumination device, each having high color saturation and improving vividness of colors of an illuminated object even when color temperature of ambient light is high, and consequently being able to reproduce colors of the illuminated object as desired.

Solution to Problem

An LED module relating to the present invention comprises: a blue LED that emits blue light; a green phosphor that absorbs a portion of the blue light emitted by the blue LED and emits green light; and a red phosphor that absorbs at least one of a portion of the blue light emitted by the blue LED and a portion of the green light emitted by the green phosphor, and emits red light, wherein a light-emission spectrum of the blue LED has a peak wavelength of no less than 420 nm and no greater than 470 nm, and a Full Width at Half Maximum (FWHM) of greater than 0 nm and no greater than 50 nm, a light-emission spectrum of the green phosphor has a peak wavelength of no less than 500 nm and no greater than 535 nm, and an FWHM of no less than 100 nm and no greater than 110 nm, a light-emission spectrum of the red phosphor has a peak wavelength of no less than 610 nm and no greater than 670 nm, and an FWHM of no less than 85 nm and no greater than 95 nm, mixed-color light of the blue light, the green light and the red light has a correlated color temperature Tc of no less than 4600 K and no greater than 7200 K, and the mixed-color light has a Distance from perfect radiator locus on uv coordinates (Duv) of no less than −12 and no greater than −6.

An illumination device relating to the present invention is provided with the same configuration as described for the LED module above.

The term Duv refers to chromatic deviation (Δuv) of light color from a blackbody radiation locus on a CIE 1960 uv chromaticity diagram, multiplied by a factor of 1000. The chromatic deviation has a positive value when above the blackbody radiation locus on the chromaticity diagram and has a negative value when below the blackbody radiation locus.

Advantageous Effects of Invention

Correlated color temperature Tc of no less than 4600 K and no greater than 7200 K in the above configuration corresponds to color temperature of a range of light colors from neutral (color temperature no less than 4600 K and no greater than 5500 K) to daylight (color temperature no less than 5700 K and no greater than 7100 K) as stipulated by JIS (Japanese Industrial Standard) Z9112. Duv of no less than −12 and no greater than −6 refers to an area on an xy chromaticity diagram that is lower (at a lower y value) than an area corresponding to illuminant color as stipulated by JIS Z9112, and signifies that light includes an increased red component, and consequently color saturation is increased. When manufacturing the LED module, by keeping peak wavelength and FWHM of the red phosphor and the green phosphor within the limits described above, color saturation can be further increased. Through the combined effects resulting from the conditions described above, an LED lamp having high color saturation can be realized, which improves vividness of an illuminated object even when color temperature of ambient light is high, and consequently is able to reproduce colors of the illuminated object as desired.

BRIEF DESCRIPTION OF DRAWINGS

FIGS. 6A-6E show examples of data from measurements of gamut area ratio Ga.

DESCRIPTION OF EMBODIMENTS

Figure 1A:
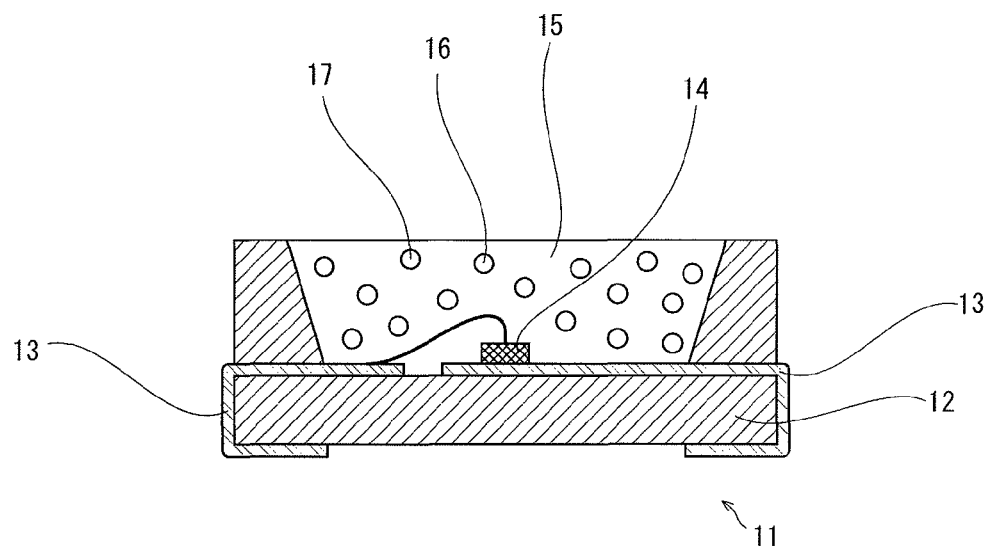
FIGS. 1A and 1B are cross-sectional diagrams each showing structure of an LED module relating to an embodiment of the present invention.

An embodiment of the present invention is explained below with reference to the drawings.
<Configuration>
FIG. 1A is a cross-sectional diagram showing structure of an LED module relating to the embodiment of the present invention.

An LED module 11 includes a package base 12, a lead 13, blue LEDs 14, a transparent sealing member 15, a green phosphor 16 and a red phosphor 17. The package base 12 is formed from an electrically insulating material such as ceramic. The lead 13 is formed from an electrically conducting material such as a metal. The transparent sealing member 15 is formed from a transparent material such as silicone.

The blue LEDs 14 are supplied with electrical power through the lead 13, thus causing emission of blue light by the blue LEDs 14. An LED of the type described above may for example be a GaN type LED.

The green phosphor 16 absorbs a portion of the blue light emitted by the blue LEDs 14 and emits green light. A phosphor of the type describe above, may for example be a YAG phosphor. The YAG phosphor may for example be $(Y_{1-x}Ce_x)_3(Al_{1-y}Ga_y)_5O_{12}$, where $0.01 \leq x \leq 5$ and $0 \leq y \leq 5$. Alternatively, any other commonly known phosphor may be used.

The red phosphor 17 absorbs at least one of a portion of the blue light emitted by the blue LEDs 14 and a portion of the green light emitted by the green phosphor 16, and emits red light. A phosphor of the type described above may for example be a CASN phosphor. The CASN phosphor may for example be $(Sr_{1-x}Ca_x)AlSiN_3:Eu^{2+}$, where $0 \leq x \leq 1$. Alternatively, any other commonly known phosphor may be used.

In the LED module 11, the blue LEDs 14 are enclosed by the transparent sealing member 15, which has the green phosphor 16 and the red phosphor 17 dispersed therein. Consequently, the LED module 11 emits mixed-color light of the blue light, the green light and the red light. Color temperature and chromatic range of the mixed-color light can be set appropriately by adjusting a combined total amount of the green phosphor 16 and the red phosphor 17 relative to each of the blue LEDs 14, and also by adjusting a mixing ratio of the green phosphor 16 and the red phosphor 17 relative to one another.

<High Color Saturation>

The following explains a method for achieving high color saturation. In the present embodiment, peak wavelength and FWHM of light-emission spectra for the blue LEDs, the green phosphor and the red phosphor are within limits shown below. Also, in the present embodiment color temperature Tc and Duv of the mixed-color light are adjusted to be within limits shown below.

Blue LEDs: peak wavelength of no less than 420 nm and no greater than 470 nm; FWHM of greater than 0 nm and no greater than 50 nm.

Green phosphor: peak wavelength of no less than 500 nm and no greater than 535 nm; FWHM of no less than 100 nm and no greater than 110 nm.

Red phosphor: peak wavelength of no less than 610 nm and no greater than 670 nm; FWHM of no less than 85 nm and no greater than 95 nm.

Mixed-color light: color temperature Tc of no less than 4600 K and no greater than 7200 K; Duv of no less than −12 and no greater than −6.

Figure 2A:
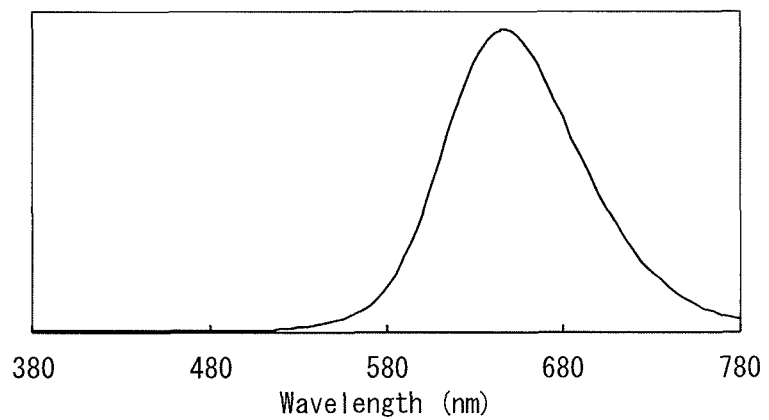
FIG. 2A shows a light-emission spectrum measured for a red phosphor.
Figure 2B:
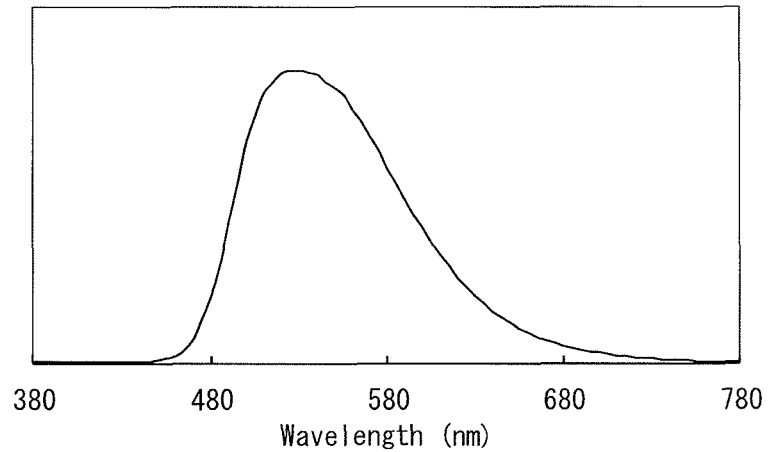
FIG. 2B shows a light-emission spectrum measured for a green phosphor and FIG. 2C shows a light-emission spectrum measured for a blue LED.
Figure 2C:
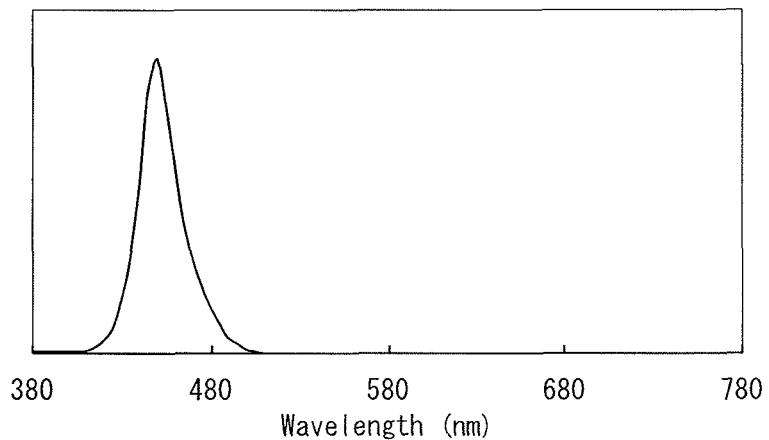
Figure 3:
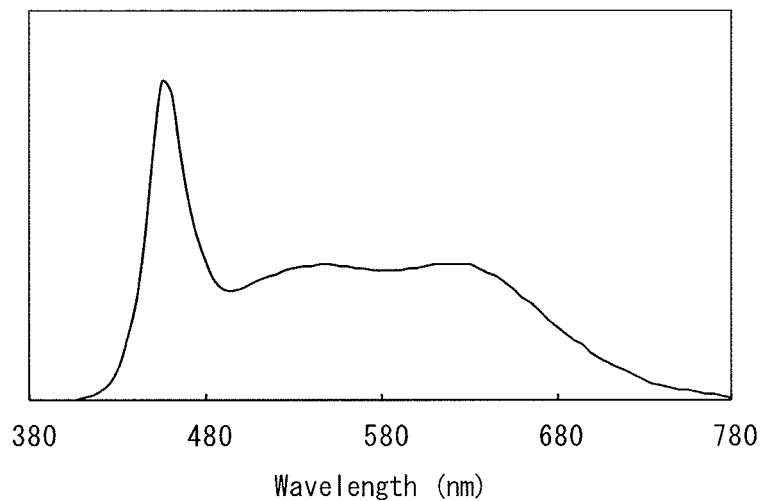
FIG. 3 shows a light-emission spectrum measured for mixed-color light of blue light, green light and red light.

The light-emission spectra were measured by the inventors of the present invention through preparation of actual test samples. FIG. 2A shows a light-emission spectrum measured for the red phosphor, FIG. 2B shows a light-emission spectrum measured for the green phosphor and FIG. 2C shows a light-emission spectrum measured for the blue LEDs. FIG. 3 shows a light-emission spectrum measured for the mixed-color light. Characteristics of the light-emission spectra are as shown below. The characteristics in the measured results are all within the limits set as objectives therefor. Consequently, the measured results show that manufacture of an LED module having characteristics within the above limits is possible.

Blue LEDs: peak wavelength of 450 nm; FWHM of 25 nm.

Green phosphor: peak wavelength of 525 nm; FWHM of 104 nm.

Red phosphor: peak wavelength of 645 nm; FWHM of 91 nm.

Mixed-color light: color temperature of 6200 K; Duv of −10.

Figure 4:
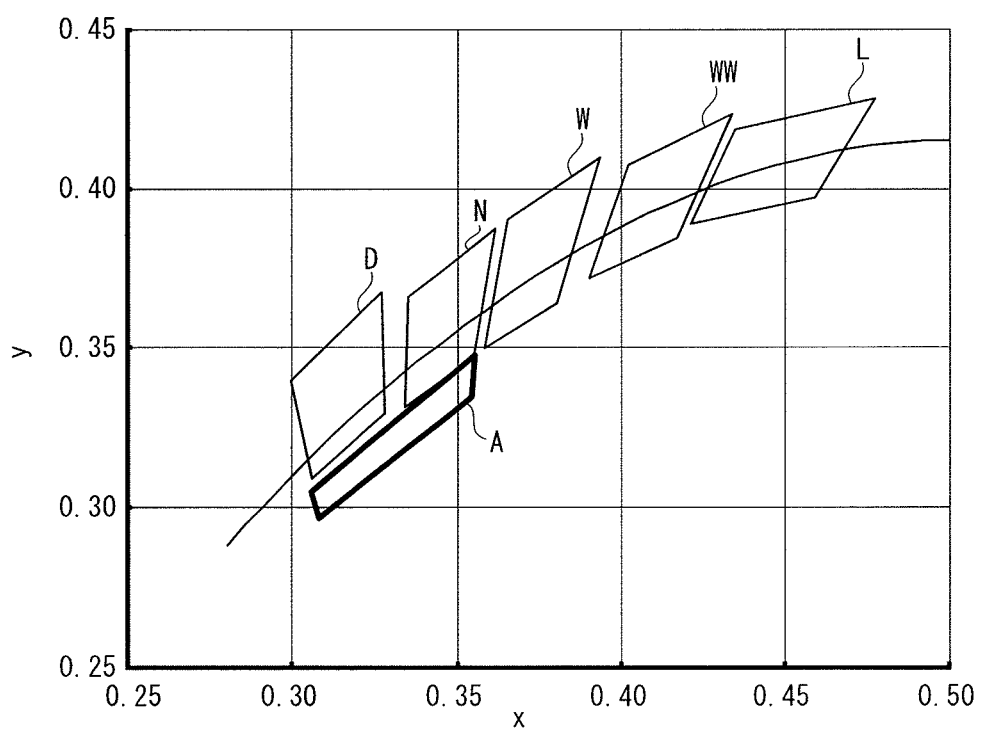
FIG. 4 shows an xy chromaticity diagram for explaining a chromatic range of the LED module relating to the embodiment of the present invention.

FIG. 4 shows an xy chromaticity diagram for explaining chromatic range of the LED module relating to the embodiment of the present invention. Chromatic range of the mixed-color light in the present embodiment is shown by area A in FIG. 4. FIG. 4 also shows chromatic ranges for light colors corresponding to incandescent L (color temperature of no less than 2600 K and no greater than 3250 K), warm white WW (color temperature of no less than 3250 K and no greater than 3800 K), white W (color temperature of no less than 3800 K and no greater than 4500 K), neutral N (color temperature of no less than 4600 K and no greater than 5500 K) and daylight D (color temperature of no less than 5700 K and no greater than 7100 K) as stipulated by JIS Z9112.

In the present embodiment, the chromatic range of the mixed-color light is from a color temperature Tc of no less than 4600 K to no greater than 7200 K, and therefore the mixed-color light in the present embodiment has color temperature in a range corresponding to neutral N and daylight D. In other words, the mixed-color light in the present embodiment has high color temperature. In the present embodiment, Duv of the mixed-color light is no less than −12 and no greater than −6, thus the chromatic range of the mixed-color light is lower on the xy chromaticity diagram than chromatic ranges stipulated for illuminants by JIS Z9112. Mixed-color light satisfying the conditions described above has a larger red component than light in the chromatic ranges stipulated for illuminants by JIS Z9112, signifying that the mixed-color light is able to reproduce colors as desired. Thus, through increasing the color temperature and also the red component of the mixed-color light, an LED module having high color saturation can be realized which improves vividness of colors of an illuminated object even when color temperature of ambient light is high, and consequently is able to reproduce colors as desired.

In the present embodiment, the range of the Duv of the mixed-color light is determined using areas of equivalent chromaticity as defined by MacAdam. Consequently, any light color included in area A in FIG. 4 is approximately equivalent, and thus can be used to achieve the objective of the present invention. Defining areas of equivalent chromaticity is explained for example in the $2^{nd}$ edition of Shikisai Kagaku Handobukku (Handbook of Color Science), page 273.

The above described realization of an LED module having high color saturation, but in some situations even further increased color saturation may be required. The following describes an LED module having further increased color saturation.

<Further Increased Color Saturation>

The following first explains gamut area ratio Ga which is used as an indicator for quantitatively measuring vividness of color of an illuminated object. Explanation is then given of a method for realizing high color saturation as measured using gamut area ratio Ga. Structure of an LED module explained herein is identical to the LED module described above, and thus explanation thereof is omitted.

(Gamut Area Ratio Ga)

Gamut area ratio Ga is defined in JIS Z8726-1990 and is calculated as described below.

Eight test colors, which are the same as test colors numbers 1-8 used when calculating the average color rendering index Ra, are illuminated using a reference illuminant and viewed colors of the test colors are plotted on a CIE 1964 U*V* uniform color space. Area of an octagon formed by joining the above plotted points is calculated.

Next, the eight test colors are illuminated using a test illuminant and viewed colors of the test colors are plotted on the CIE1964U*V* uniform color space. Area of an octagon formed by joining the above plotted points is calculated.

Finally, gamut area ratio Ga is calculated using the following formula: Ga=(area of test illuminate octagon)/(area of reference illuminant octagon)×100.

Herein, the reference illuminant is either a blackbody radiator of the same correlated color temperature as the test illuminant, or CIE daylight. The eight test colors used in calculation of gamut area ratio Ga are of various different hues and each have a Munsell value for brightness of 6. The above test colors are a sample of colors of approximately medium vividness. Consequently, gamut area ratio Ga is used as an indicator of average vividness of colors. Gamut area ratio Ga of less than 100 indicates that color saturation is decreased and thus colors appear more subdued. Gamut area ratio of greater than 100 indicates that color saturation is increased and thus colors appear more vivid. In general, colors of an object are considered to be more aesthetically pleasing when saturation thereof is increased, therefore gamut area ratio Ga can be used as an effective indicator as to whether colors can be viewed as desired.

Figure 5:
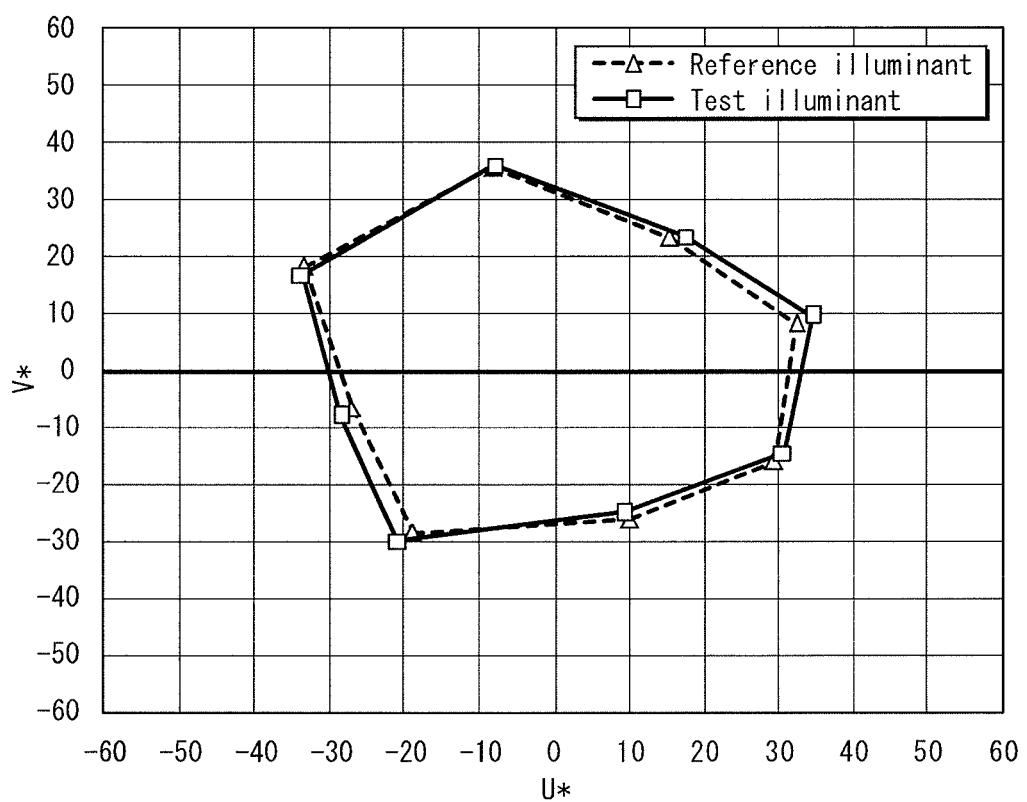
FIG. 5 shows a U*V* uniform color space for a test illuminant having color temperature Tc of 6200 K and Duv of −10.

FIG. 5 shows one example of a U*V* uniform color space for a test illuminant with color temperature Tc of 6200 K and Duv of −10. Gamut area ratio Ga was 105 for the example shown in FIG. 5.

(Method for Realizing Further Increased Color Saturation)

The following explains a method for realizing an LED module having high color saturation. The LED module includes blue LEDs, a green phosphor and a red phosphor, which are the same as the blue LEDs, green phosphor and red phosphor described above. In other words, the green phosphor has a peak wavelength of no less than 500 nm and no greater than 535 nm, and the red phosphor has a peak wavelength of no less than 610 nm and no greater than 670 nm.

The inventors of the present invention calculated gamut area ratio Ga while varying color temperature Tc, Duv, and a difference $\Delta\lambda_{R-G}$ between peak wavelength of the green phosphor and peak wavelength of the red phosphor. More specifically, the difference $\Delta\lambda_{R-G}$ was varied between a minimum of 75 nm and a maximum of 170 nm at intervals of 5 nm, color temperature Tc was varied between a minimum of 4600 K and a maximum of 7200 K at intervals of 100 K, and Duv was varied between a minimum of −12 and a maximum −6 at intervals of 1 unit. Gamut area ratio Ga was calculated for each of the above values. Each instance in which gamut area ratio Ga was greater than 100 was judged to be an example of realizing high color saturation. The above measurements of gamut area ratio Ga produced a vast amount of data, thus complete inclusion of the data in the Description of the present invention would be impractical. FIGS. 6A-6E show only a small proportion of the data gained from the measurements of the gamut area ratio Ga.

FIG. 6A shows data for when peak wavelength of the green phosphor was at a maximum value of 535 nm and peak wavelength of the red phosphor was at a minimum value of 610 nm, in other words when the difference $\Delta\lambda_{R-G}$ was at a minimum value of 75 nm. FIG. 6A shows for example that gamut area ratio Ga was 97.5 for a situation in which the red phosphor had peak wavelength of 610 nm and FWHM of 91 nm, the green phosphor had peak wavelength of 535 nm and FWHM of 104 nm, color temperature Tc was 4600 K, and Duv was −6.

FIG. 6B shows data for when peak wavelength of the green phosphor was at the maximum value of 535 nm and peak wavelength of the red phosphor was at a maximum value of 670 nm, in other words when the difference $\Delta\lambda_{R-G}$ was at an intermediate value of 135 nm.

FIG. 6C shows data for when peak wavelength of the green phosphor was at an intermediate value of 520 nm and peak wavelength of the red phosphor was at an intermediate value of 640 nm, in other words when the difference $\Delta\lambda_{R-G}$ was at an intermediate value of 120 nm.

FIG. 6D shows data for when peak wavelength of the green phosphor was at a minimum value of 500 nm and peak wavelength of the red phosphor was at the minimum value of 610 nm, in other words when the difference $\Delta\lambda_{R-G}$ was at an intermediate value of 110 nm.

FIG. 6E shows data for when peak wavelength of the green phosphor was at the minimum value of 500 nm and peak wavelength of the red phosphor was at the maximum value of 670 nm, in other words when the difference $\Delta\lambda_{R-G}$ was at a maximum value of 170 nm.

In the measurements shown in FIGS. 6A-6E, gamut area ratio Ga was only less than 100 in four measurements shown in FIG. 6A. In all other measurements shown in FIGS. 6A-6E the gamut area ratio Ga was at least 100, showing that realization of high color saturation is possible. Through use of a vast amount of data measured for gamut area ratio Ga, the inventors of the present invention were able to discover that gamut area ratio Ga is at least 100 when the following condition is satisfied.

$$170 \text{ nm} \geq \Delta\lambda_{R-G} \geq Tc(0.006+0.0025(Duv+6))-Duv \times 10 \text{ nm} \quad \text{(MATH 1)}$$

Figure 7A:
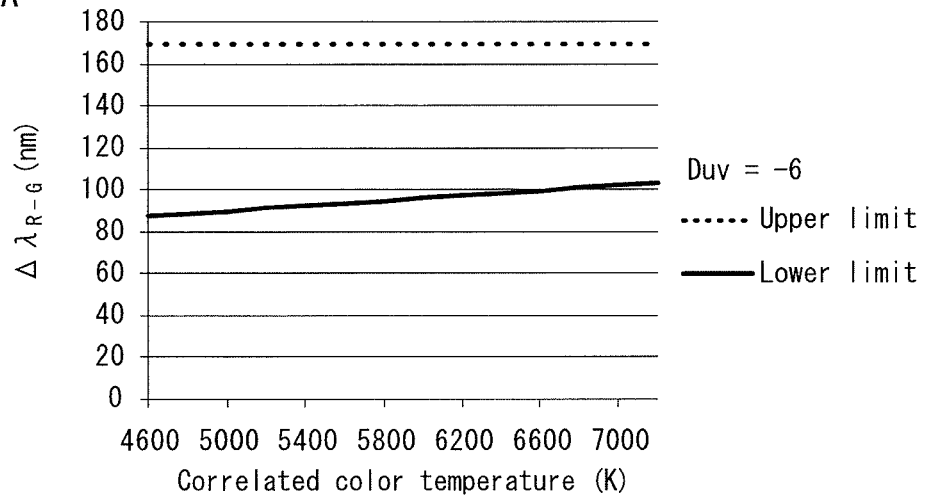
FIGS. 7A-7C show examples of ranges in which MATH 1 is satisfied for fixed Duv.
Figure 7B:
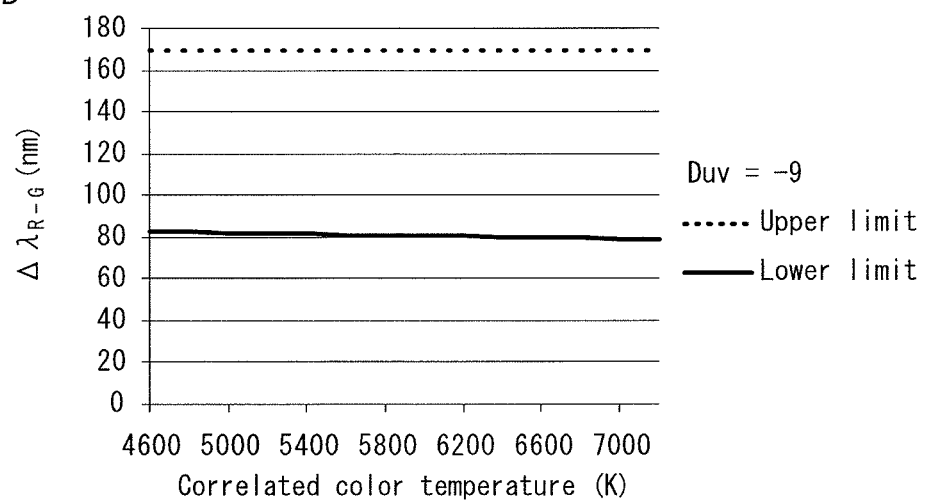
Figure 7C:
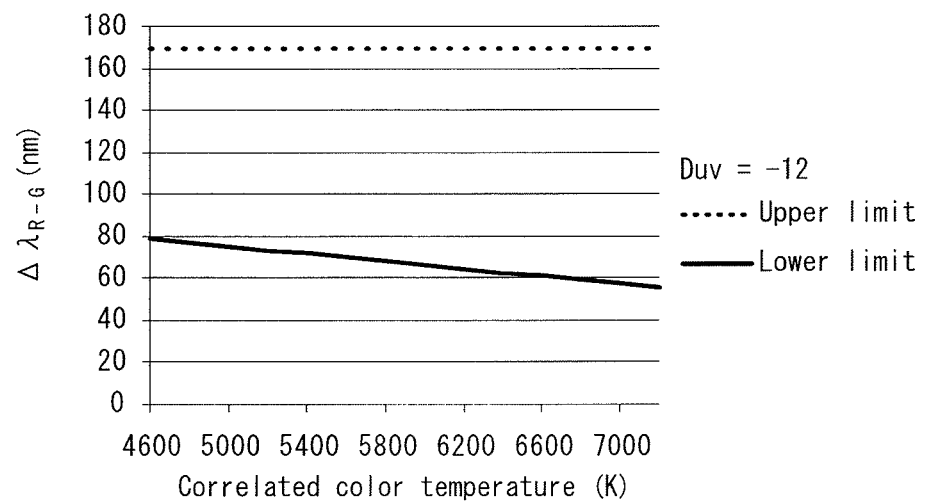

FIGS. 7A-7C and FIGS. 8A-8C show examples of ranges where MATH 1 is satisfied. FIGS. 7A-7C show the difference $\Delta\lambda_{R-G}$ against color temperature Tc for when Duv is fixed at values of −6, −9 and −12 respectively. Thus, FIGS. 7A-7C show ranges satisfying MATH 2-4 respectively, which are shown below.

$$\text{When } Duv=-6: 170 \text{ nm} \geq \Delta\lambda_{R-G} \geq Tc(0.006)+60 \text{ nm} \quad \text{(MATH 2)}$$

$$\text{When } Duv=-9: 170 \text{ nm} \geq \Delta\lambda_{R-G} \geq Tc(-0.0015)+90 \text{ nm} \quad \text{(MATH 3)}$$

$$\text{When } Duv=-12: 170 \text{ nm} \geq \Delta\lambda_{R-G} \geq Tc(-0.009)+120 \text{ nm} \quad \text{(MATH 4)}$$

Figure 8A:
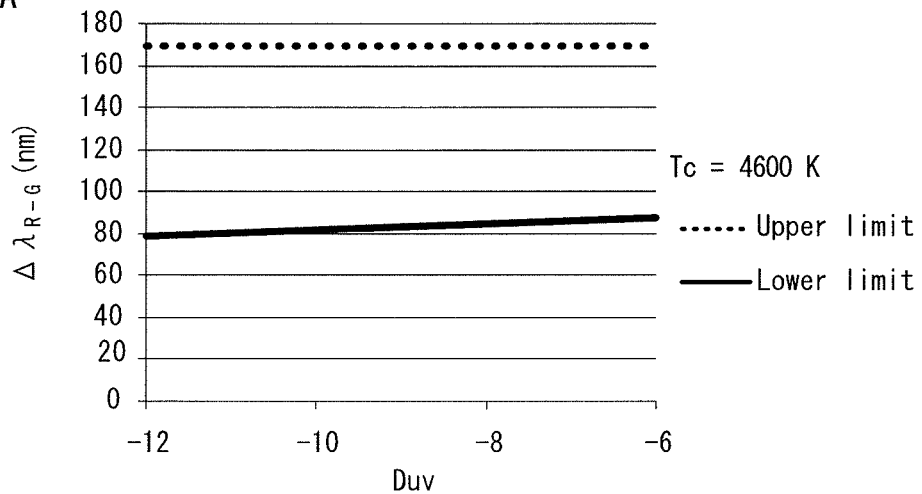
FIGS. 8A-8C show examples of ranges in which MATH 1 is satisfied for fixed color temperature.
Figure 8B:
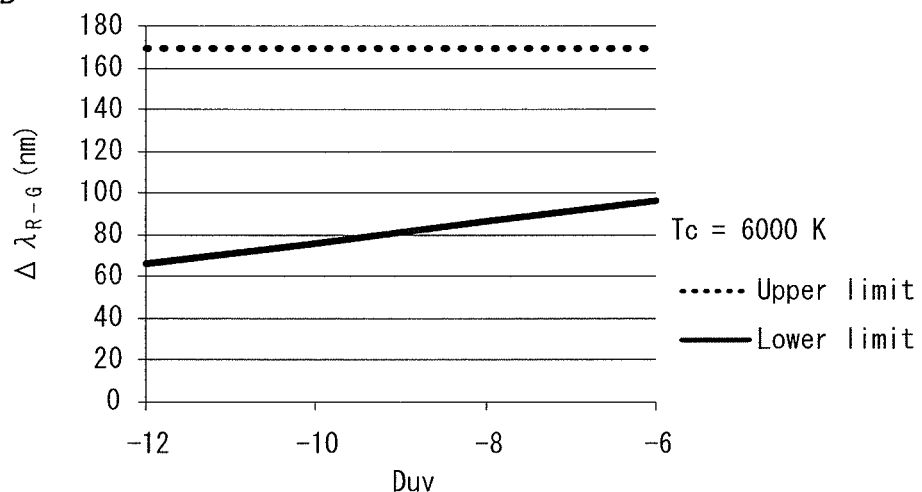
Figure 8C:
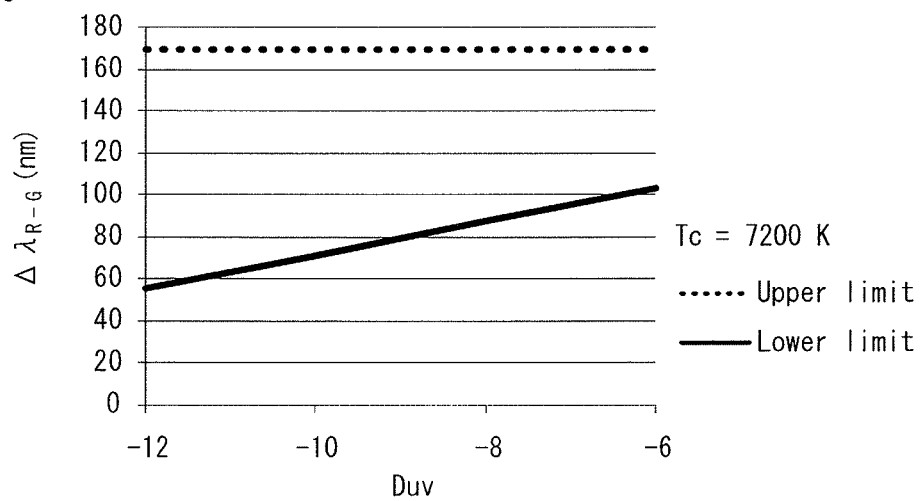

FIGS. 8A-8C show the difference $\Delta\lambda_{R-G}$ against Duv for when color temperature Tc is fixed at values of 4600 K, 6000 K and 7200 K respectively. Thus, FIGS. 8A-8C show ranges satisfying MATH 5-7 respectively, which are shown below.

$$\text{When } Tc=4600 \text{ K}: 170 \text{ nm} \geq \Delta\lambda_{R-G} \geq 1.5 \times Duv+96.6 \text{ nm} \quad \text{(MATH 5)}$$

$$\text{When } Tc=6000 \text{ K}: 170 \text{ nm} \geq \Delta\lambda_{R-G} \geq 5 \times Duv+126 \text{ nm} \quad \text{(MATH 6)}$$

$$\text{When } Tc=7200 \text{ K}: 170 \text{ nm} \geq \Delta\lambda_{R-G} \geq 8 \times Duv+151.2 \text{ nm} \quad \text{(MATH 7)}$$

As shown above, through adjustment of color temperature and chromatic range of the mixed-color light so as to satisfy MATH 1, gamut area ratio Ga of at least 100 can be achieved. Consequently, an LED module having further increased color saturation can be realized.

<Supplementary Explanation>

1. LED Module Structure

Figure 1B:
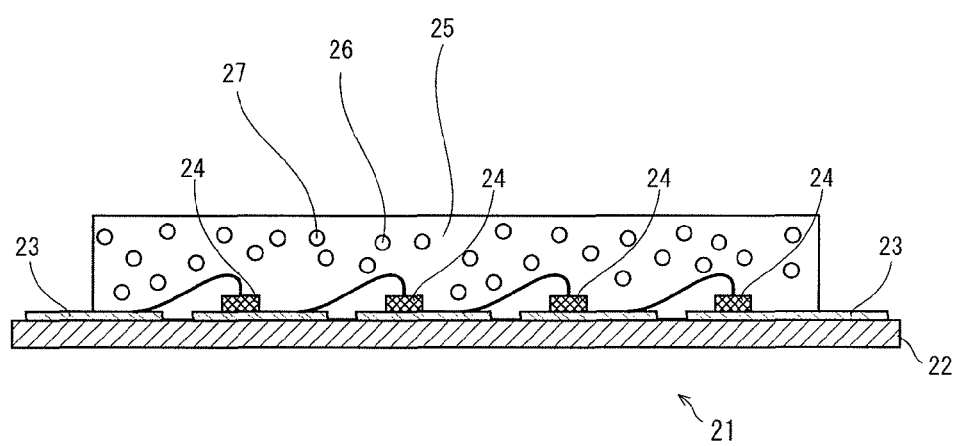

In the embodiment, structure of the LED module was explained using FIG. 1A, but in the present invention the LED module may have a different structure so long as the LED module includes the blue LED, the green phosphor and the red phosphor. For example, the LED module may alternatively have a structure as shown in FIG. 1B. FIG. 1B shows an LED module 21 which includes a circuit board 22, a wiring pattern 23, blue LEDs 24, a transparent sealing member 25, a green phosphor 26 and a red phosphor 27. Further alternatively, the LED module may be a bullet-type LED module.

2. Illumination Device A

The above LED module is suitable for use in an illumination device as described below.

Figure 9A:
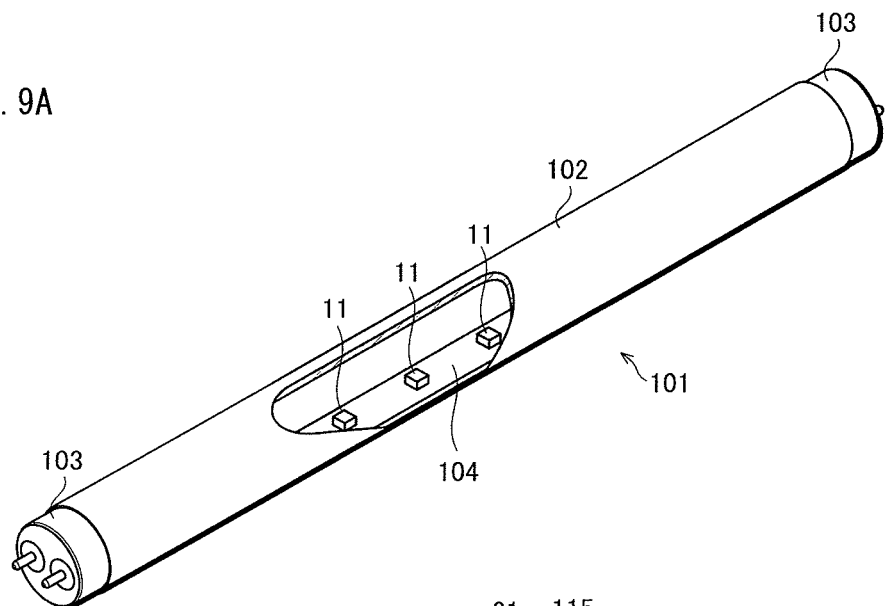
FIGS. 9A-9C each show an example of structure of an illumination device.

FIG. 9A shows an example in which the LED module 11 is used in an illumination device 101, which is a straight tube-type illumination device. The illumination device 101 includes a transparent part 102 which is a straight tube, base caps 103, a substrate 104 and a plurality of the LED modules 11. The present example is for a straight tube-type illumination device, but the LED module may of course alternatively be used in a ring tube-type illumination device.

Figure 9B:
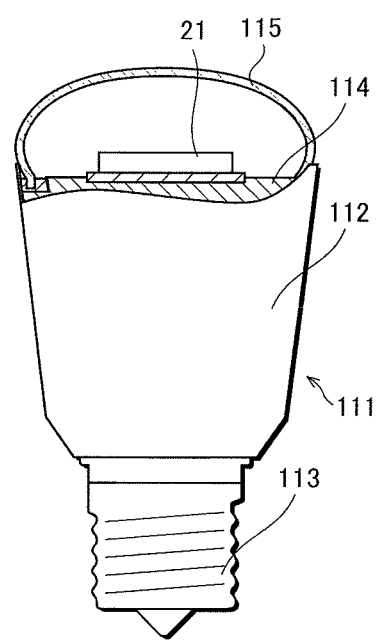

FIG. 9B shows an example in which the LED module 21 is used in an illumination device 111, which is a bulb-type illumination device. The illumination device 111 includes a body 112, a base cap 113, a substrate 114, a globe 115 and the LED module 21.

Figure 9C:
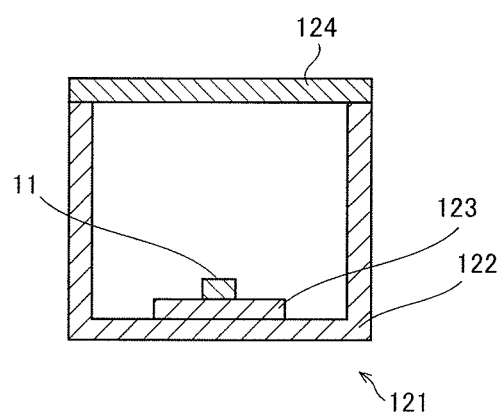

FIG. 9C shows an example in which the LED module 11 is used in an illumination device 121, which has a cylindrical shape. The illumination device 121 includes a housing 122 which is cylindrical, a substrate 123, a transparent part 124 and the LED module 11.

3. Illumination Device B

In each of the illumination devices described above, an LED module is used which emits mixed-color light of blue light, green light and red light, but the above is not a limitation on the present invention. Alternatively, if an illumination device has a structure such as described below, the illumination device can emit mixed-color light of blue light, green light and red light even if an LED module which emits blue light is used therein.

Figure 10A:
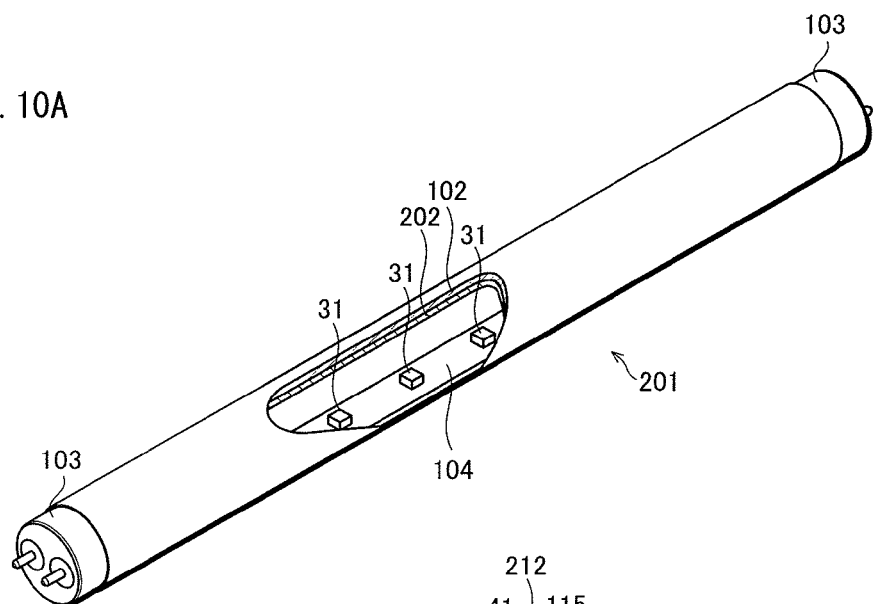
FIGS. 10A-10C each show an example of structure of an illumination device.

FIG. 10A shows an example in which an LED module 31, which emits blue light, is used in an illumination device 201, which is a straight tube-type illumination device. The illumination device 201 includes a transparent part 102 which is a straight tube, base caps 103, a substrate 104, a phosphor layer 202 and a plurality of the LED modules 31. The phosphor layer 202 includes the green phosphor and the red phosphor, and is formed on an inner surface of the transparent part 102. The phosphor layer 202 is not limited to being formed on the inner surface of the transparent part 102, and alternatively may be formed on an outer surface of the transparent part 102. Further alternatively, the green phosphor and the red phosphor may be included within material forming the transparent part 102.

Figure 10B:
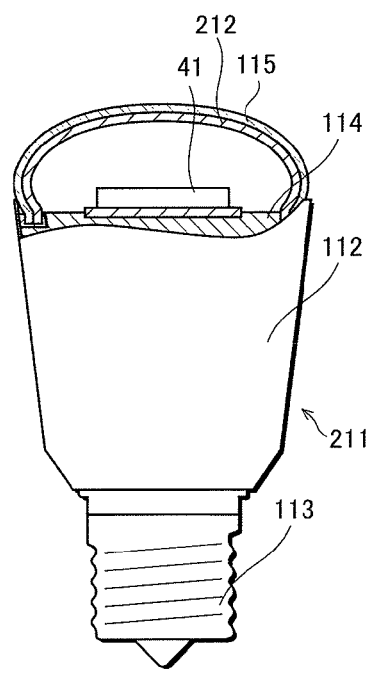

FIG. 10B shows an example in which an LED module 41, which emits blue light, is used in an illumination device 211, which is a bulb-type illumination device. The illumination device 211 includes a body 112, a base cap 113, a substrate 114, a globe 115, a phosphor layer 212 and the LED module 41. The phosphor layer 212 includes the green phosphor and the red phosphor, and is formed on an inner surface of the globe 115. The phosphor layer 212 is not limited to being formed on the inner surface of the globe 115, and alternatively may be formed on an outer surface of the globe 115. Further alternatively, the green phosphor and the red phosphor may be included in material forming the globe 115.

Figure 10C:
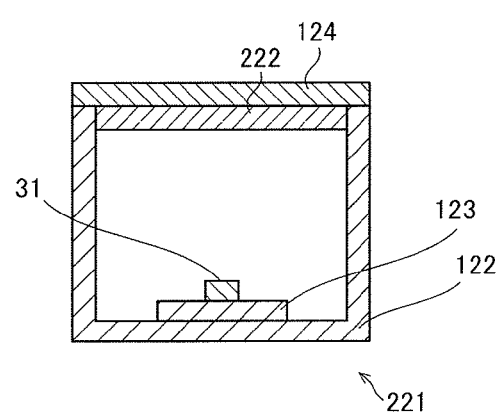

FIG. 10C shows an example in which the LED module 31 is used in an illumination device 221, which has a cylindrical shape. The illumination device 221 includes a housing 122 which is cylindrical, a substrate 123, a transparent part 124, a phosphor layer 222 and the LED module 31. The phosphor layer 222 includes the green phosphor and the red phosphor, and is formed on an inner surface of the transparent part 124. The phosphor layer 222 is not limited to being formed on the inner surface of the transparent part 124, and alternatively may be formed on an outer surface of the transparent part 124. Further alternatively, the green phosphor and the red phosphor may be included within material forming the transparent part 124.

In each of the illumination devices described above, the green phosphor and the red phosphor are both included in the phosphor layer, although the above is not a limitation on the present invention, and alternatively the same effect may be achieved by including one of the green phosphor and the red phosphor in the phosphor layer and the other of the green phosphor and the red phosphor in the LED module.

4. Application Examples

Each of the illumination devices described above may for example be applicable for use in a lamp for product display. Lamps used in product display for example include lamps included in display cases and other equipment for displaying products, and also lamps provided on ceilings, walls and shelves in shops, warehouses and the like. Alternatively, the LED module relating to the present invention may be used to create a spotlight, and therefore may be used as an alternative in a field in which conventionally a halogen lamp provided with a reflective mirror is used.

INDUSTRIAL APPLICABILITY

The present invention is applicable for use in a lamp.

REFERENCE SIGNS LIST

11 LED module
12 package base
13 lead
14 blue LED
15 transparent sealing member
16 green phosphor
17 red phosphor
21 LED module
22 circuit board
23 wiring pattern
24 blue LED
25 transparent sealing member
26 green phosphor
27 red phosphor
31 LED module
41 LED module
101 illumination device
102 transparent part
103 base cap
104 substrate
111 illumination device
112 body
113 base cap
114 substrate
115 globe
121 illumination device
122 housing
123 substrate
124 transparent part
201 illumination device
202 phosphor layer
211 illumination device
212 phosphor layer
221 illumination device
222 phosphor layer

The invention claimed is:

1. An LED module comprising:
a blue LED that emits blue light;
a green phosphor that absorbs a portion of the blue light emitted by the blue LED and emits green light; and
a red phosphor that absorbs at least one of a portion of the blue light emitted by the blue LED and a portion of the green light emitted by the green phosphor, and emits red light, wherein
a light-emission spectrum of the blue LED has a peak wavelength of no less than 420 nm and no greater than 470 nm, and a Full Width at Half Maximum of greater than 0 nm and no greater than 50 nm,
a light-emission spectrum of the green phosphor has a peak wavelength of no less than 500 nm and no greater than 535 nm, and a Full Width at Half Maximum of no less than 100 nm and no greater than 110 nm,
a light-emission spectrum of the red phosphor has a peak wavelength of no less than 610 nm and no greater than 670 nm, and a Full Width at Half Maximum of no less than 85 nm and no greater than 95 nm,
mixed-color light of the blue light, the green light and the red light has a correlated color temperature Tc of no less than 4600 K and no greater than 7200 K,
the mixed-color light has a Distance from perfect radiator locus on uv coordinates of no less than −12 and no greater than −6, and
a difference $\Delta\lambda_{R\text{-}G}$ between the peak wavelength of the green phosphor and the peak wavelength of the red phosphor satisfies the following condition:

$$170\ \text{nm} \geq \Delta\lambda_{R\text{-}G} \geq Tc(0.006+0.0025(Duv+6))-Duv\times 10\ \text{nm},$$

where Duv indicates the Distance from perfect radiator locus on uv coordinates.

2. The LED module in claim 1, wherein
the green phosphor is a YAG phosphor and the red phosphor is a CASN phosphor.

3. An illumination device comprising:
a blue LED that emits blue light;
a green phosphor that absorbs a portion of the blue light emitted by the blue LED and emits green light; and
a red phosphor that absorbs at least one of a portion of the blue light emitted by the blue LED and a portion of the green light emitted by the green phosphor, and emits red light, wherein
a light-emission spectrum of the blue LED has a peak wavelength of no less than 420 nm and no greater than 470 nm, and a Full Width at Half Maximum of greater than 0 nm and no greater than 50 nm,
a light-emission spectrum of the green phosphor has a peak wavelength of no less than 500 nm and no greater than 535 nm, and a Full Width at Half Maximum of no less than 100 nm and no greater than 110 nm,
a light-emission spectrum of the red phosphor has a peak wavelength of no less than 610 nm and no greater than 670 nm, and a Full Width at Half Maximum of no less than 85 nm and no greater than 95 nm,
mixed-color light of the blue light, the green light and the red light has a correlated color temperature Tc of no less than 4600 K and no greater than 7200 K,
the mixed-color light has a Distance from perfect radiator locus on uv coordinates of no less than −12 and no greater than −6, and
a difference $\Delta\lambda_{R\text{-}G}$ between the peak wavelength of the green phosphor and the peak wavelength of the red phosphor satisfies the following condition:

$$170\ \text{nm} \geq \Delta\lambda_{R\text{-}G} \geq Tc(0.006+0.0025(Duv+6))-Duv\times 10\ \text{nm},$$

where Duv indicates the Distance from perfect radiator locus on uv coordinates.

4. The illumination device in claim 3, wherein
the green phosphor is a YAG phosphor and the red phosphor is a CASN phosphor.

* * * * *